United States Patent
Ihs

(10) Patent No.: US 10,320,375 B2
(45) Date of Patent: Jun. 11, 2019

(54) SOC SUPPLY DROOP COMPENSATION

(71) Applicant: Endura Technologies LLC, San Diego, CA (US)

(72) Inventor: Hassan Ihs, San Diego, CA (US)

(73) Assignee: Chaoyang Semiconductor Jiangyin Technology Co., Ltd., Jiangyin (CN)

( * ) Notice: Subject to any disclaimer, the term of this patent is extended or adjusted under 35 U.S.C. 154(b) by 0 days.

(21) Appl. No.: 15/640,922

(22) Filed: Jul. 3, 2017

(65) Prior Publication Data

US 2018/0062628 A1    Mar. 1, 2018

Related U.S. Application Data

(60) Provisional application No. 62/357,852, filed on Jul. 1, 2016.

(51) Int. Cl.
| | |
|---|---|
| H03K 5/15 | (2006.01) |
| G01R 19/165 | (2006.01) |
| G05F 1/565 | (2006.01) |
| G05F 3/08 | (2006.01) |
| H02M 3/155 | (2006.01) |
| H03L 7/089 | (2006.01) |
| H03K 5/00 | (2006.01) |

(52) U.S. Cl.
CPC .............. *H03K 5/15* (2013.01); *G01R 19/165* (2013.01); *G05F 1/565* (2013.01); *G05F 3/08* (2013.01); *H02M 3/155* (2013.01); *H03L 7/0891* (2013.01); *H03K 2005/00019* (2013.01)

(58) Field of Classification Search
CPC ........... H03K 5/15; H03K 2005/00019; H03K 5/1252; H03K 2005/00058; G05F 3/08; H02M 3/155; H03L 7/0891
See application file for complete search history.

(56) References Cited

U.S. PATENT DOCUMENTS

| | | |
|---|---|---|
| 2003/0112038 A1 | 6/2003 | Naffziger et al. |
| 2004/0183613 A1* | 9/2004 | Kurd .................. G01K 7/32 |
| | | 331/186 |
| 2005/0022042 A1 | 1/2005 | Tam et al. |
| 2005/0024035 A1 | 2/2005 | Tabaian et al. |
| 2011/0291630 A1 | 12/2011 | Konstadinidis et al. |
| 2012/0187991 A1* | 7/2012 | Sathe ................. H03K 5/135 |
| | | 327/158 |
| 2013/0049828 A1 | 2/2013 | Kim et al. |

OTHER PUBLICATIONS

International Search Report on related PCT Application No. PCT/US2017/040597 from International Searching Authority (KIPO) dated Nov. 8, 2017.
Written Opinion on related PCT Application No. PCT/US2017/040597 from International Searching Authority (KIPO) dated Nov. 8, 2017.

* cited by examiner

*Primary Examiner* — Jung Kim
(74) *Attorney, Agent, or Firm* — Klein, O'Neill & Singh, LLP

(57) ABSTRACT

Droop monitors spread across a system-on-chip (SoC) monitor for voltage droops in regulated supply voltage supplied to logic circuitry of the SoC. In the event of a voltage droop, a clock signal supplied to the logic circuitry is stretched, to temporarily increase a period of the clock signal. The droop monitors may include a sensing delay line provided voltage at the regulated supply voltage, and a reference delay line supplied with a reference voltage, with operations of the delay lines monitored to determine a voltage droop.

14 Claims, 12 Drawing Sheets

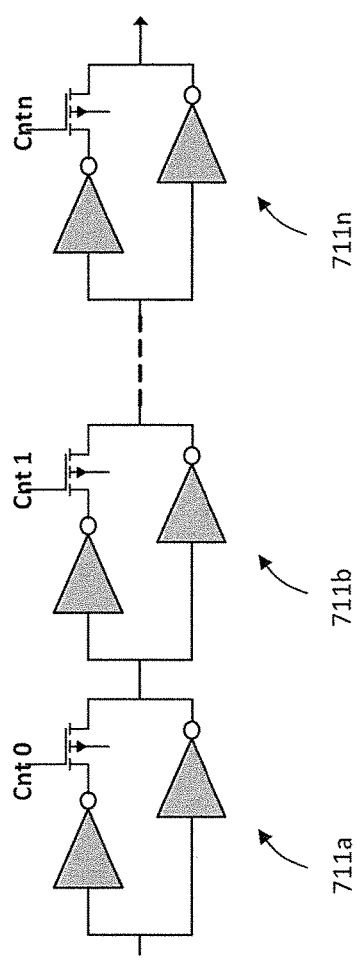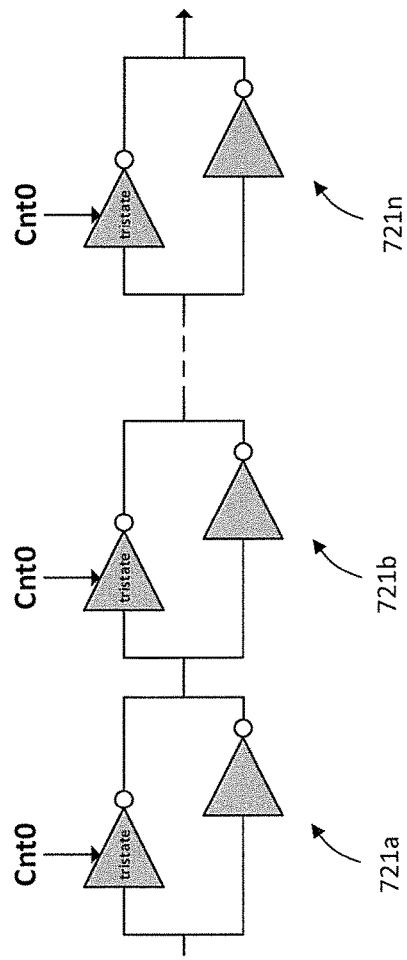
FIG. 7A
FIG. 7B

SOC SUPPLY DROOP COMPENSATION

CROSS REFERENCE TO RELATED APPLICATION

This application claims the benefit of the filing date of U.S. Provisional Patent Application No. 62/357,852, filed on Jul. 1, 2016, the disclosure of which is incorporated by reference herein.

BACKGROUND OF THE INVENTION

The present invention relates generally to supply of power to integrated circuits, and more particularly to detecting and/or compensating for power supply droops to integrated circuits.

Integrated circuits may be largely quiescent at times, drawing little power, while at other times may in whole or in part require large amounts of power. The changes in utilized power may present difficulties in providing stable power to the circuitry, and voltage supplied may decrease, or droop, when power regulation circuits are faced with rapid increases in power demands. These voltage droops may result in slower operation of integrated circuitry, and may result in combinatorial logic failures, particularly for system on chip (SoC) devices, in which voltage droops may not be uniform over the device.

FIGS. 10A and 10B illustrate a load current transient, in which load current rapidly increases, and a corresponding voltage droop. In the example of FIGS. 10A and 10B, timing failures for combinatorial logic may occur once the supply voltage decreases below 0.9 Volts, which is shown as occurring. In other words, temporary mismatch between load current and voltage regulator current delivery leads to power supply droop.

The effect of supply droops in SoC is to lead to failure in sampled combinational paths. Supply droops increase the delay in logic paths. Supply droops are mainly caused by fast SoC load current transients.

BRIEF SUMMARY OF THE INVENTION

Prevention of logic failures comprises either or both preventing a supply voltage droop from taking place and/or allow more clock delay to logic to resolve failure-free. A way of detecting a supply droop is to mimic the mechanism of logic path failure with a delay line monitor tuned to fail earlier than the most critical path of a System-on-Chip (SoC) during a supply droop transient. A supply droop transient may be detected using a droop detector, for example the droop detector(s) discussed hereon. Clock stretching comprises, upon droop detection, temporarily stretching a clock period of a clock signal used by logic circuitry of the SoC to prevent critical paths failure. Stretching temporarily the clock period during a load transient, inherently reduces the load current (CVF) and thus reduces the droop amplitude. The benefits of clock stretching may be twofold. Clock pulse skipping is more aggressive in creating large voltage ripple and sever performance throttling. Clock stretching with finer timing resolution keeps voltage ripple and performance throttling under control.

In some embodiments, novel and inventive aspects include one, some, or all of:

A clock stretcher scheme to prevent logic failure in presence of supply voltage droop.

Distributed droop monitors across sensitive areas of an SoC die.

A wheel having a turning needle to stretch the SoC clock.

An analog implementation of a droop monitor using analog calibrated delay lines.

A digital implementation of a droop monitor using digitally calibrated delay lines.

Some embodiments provide a system for compensating for voltage droops in power supplied to integrated circuitry, comprising: a plurality of droop monitors within an integrated circuit, the droop monitors configured to detect occurrence of a droop in voltage level below a specified level of a regulated supply voltage; and clock adjustment circuitry configured to stretch a period of a clock signal supplied to portions of the integrated circuit in response to detection of the occurrence of the droop in voltage level below the specified level.

Some embodiments provide a method for compensating for voltage droops in power supplied to integrated circuitry, comprising: Operating integrated circuitry of a system-on-chip (SoC) using a first clock signal at a first clock frequency, the integrated circuitry of the SoC including SoC logic circuitry, first integrated circuitry, and second integrated circuitry; monitoring speed of operation of first integrated circuitry supplied with a regulated supply voltage with respect to speed of operation of second integrated circuitry supplied with a first voltage level; and transitioning operation of the integrated circuitry of the SoC to use of a second clock signal of a plurality of clock signals, the plurality of clock signals including the first clock signal, each of the plurality of clock signals having a same frequency but having differing phases, with the transitioning of operation of the integrated circuitry of the SoC to use of the second clock signal resulting in stretching of a clock period of a clock signal provided to the integrated circuitry of the SoC.

These and other aspects of the invention are more fully comprehended upon review of this disclosure.

BRIEF DESCRIPTION OF THE FIGURES

FIGS. 7A and 7B illustrate an embodiment of digitally controlled delayed lines, for example for use in the monitor block of FIG. 6.

DETAILED DESCRIPTION

Some embodiments in accordance with aspects of the invention include a plurality of droop monitors within an integrated circuit, the droop monitors configured to detect occurrence of a droop in voltage level below a specified level of a regulated supply voltage, and clock adjustment circuitry configured to stretch a period of a clock signal supplied to portions of the integrated circuit in response to detection of the occurrence of the droop in voltage level below the specified level.

In some embodiments the droop monitors monitor a speed of execution of sensing integrated circuitry compared to speed of execution of reference integrated circuitry. In some embodiments the sensing integrated circuitry and the reference integrated circuitry each comprise a delay line. In some embodiments the reference integrated circuitry is provided power at a first voltage level and the sensing integrated circuitry is provided power at the regulated supply voltage level.

In some embodiments the clock adjustment circuitry selects a system clock signal at a particular phase from a plurality of clock signals each having different phases. In some embodiments the clock adjustment circuitry stretches the period of the system clock signal supplied to portions of the integrated circuit by selecting a next to be used clock signal that is phase delayed compared to a currently used clock signal.

Figure 1:
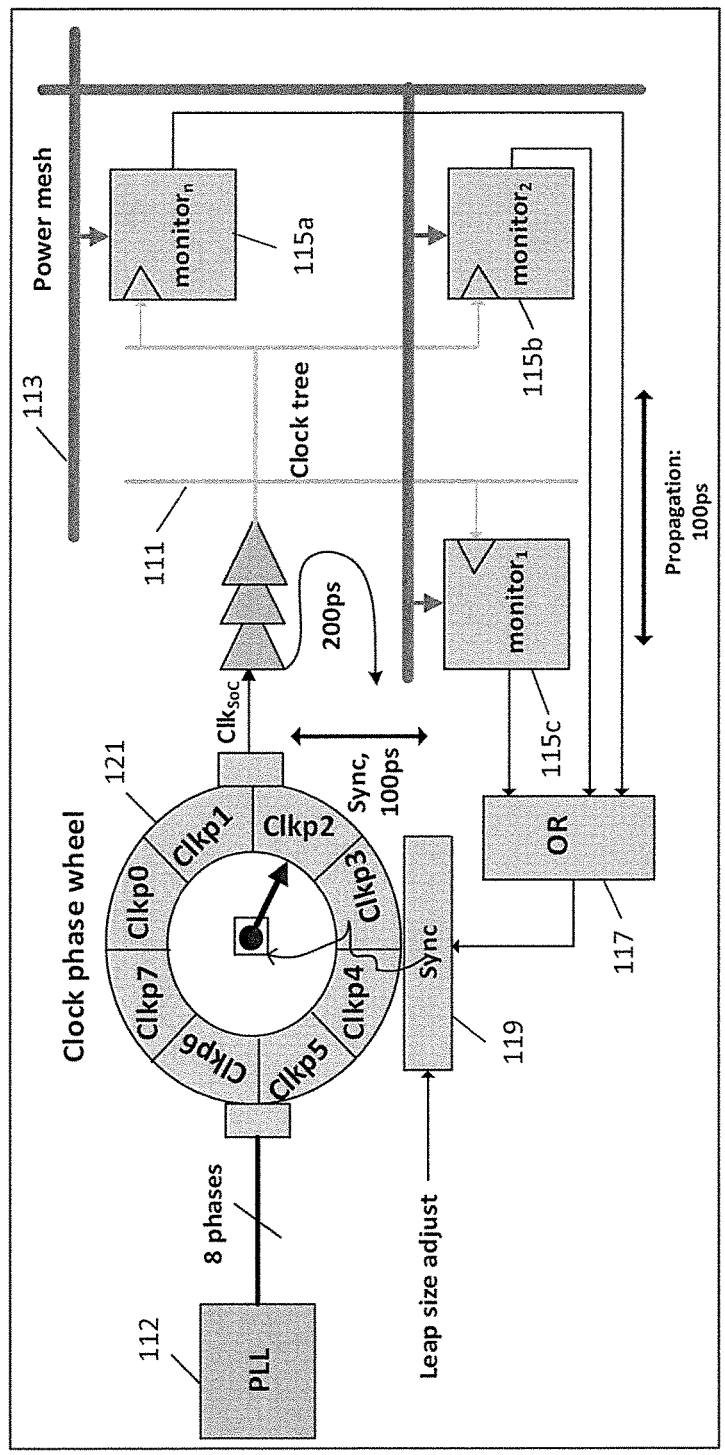
FIG. 1 is a block diagram of a system in accordance with aspects of the invention.

FIG. 1 is a block diagram of a system in accordance with aspects of the invention. A clock tree 111 distributes a system clock signal generated by a PLL 112 to areas of an integrated circuit for clocking operations of circuitry of the integrated circuit. A power mesh 113 similarly distributes regulated power to the circuitry of the integrated circuit. The regulated power is provided by a voltage regulator (not shown). In some embodiments the voltage regulator is part of a chip of the integrated circuit, and may be considered an embedded voltage regulator, and in some embodiments the voltage regulator is provided in some other chip. In most embodiments the voltage regulator is a DC-DC switching converter.

A plurality of monitor blocks 115a-c receive power from the power mesh and the clock signal from the clock tree. The monitor blocks are generally distributed in different areas of the integrated circuit. The monitor blocks determine if the regulated power from the voltage regulator drops below a predefined level. In some embodiments the monitor blocks determine if the regulated power from the voltage regulator drops below the predefined level by comparing speed of operation of reference integrated circuitry with speed of operation of sensing integrated circuitry. In some embodiments the sensing integrated circuitry and the reference integrated circuitry each comprise a delay line. In some embodiments the sensing regulated circuitry is provided the regulated power from the voltage regulator and the reference integrated circuitry is provided power from a different power regulator. In some embodiments the power from a different power regulator is regulated to be at a voltage less than a nominally expected voltage from the voltage regulator, but also at a voltage greater than a voltage at which a failure of expected operation of combinatorial logic circuitry is expected to occur.

In operation, if any of the monitor blocks determine that the regulated power from the voltage regulator drops below the predefined level, indicative of a power droop, then the system clock signal for clocking operations of the circuitry of the integrated circuit is stretched. In most embodiments the clock signal is stretched by replacing a then currently selected clock signal with a clock signal at the same frequency, but phase shifted so as to transition at a slightly later time. In some embodiments, however, clock stretching may be performed by adjusting operation of a voltage controlled oscillator (VCO), for example by first slowing operation of the VCO to lengthen a clock period and then speeding operation of the VCO so as to return the frequency of the clock signal to the frequency prior to slowing of the VCO.

In the embodiment of FIG. 1, each of the monitor blocks provides a signal indicating a power droop to an OR block 117. An output of the OR block is provided to a sync block 119, which provides a clock selection signal to a clock phase wheel 121. The clock phase wheel receives a plurality of clock signals at a same frequency, but differing in phase, from the PLL 112, and outputs a selected one of the clock signals as the system clock signal. In some embodiments the clock phase wheel is implemented using multiplexer circuitry, or circuitry providing for similar operations. In some embodiments the sync block additionally receives a leap size adjustment signal, which indicates to the sync block an amount to stretch the system clock signal.

Figure 2:
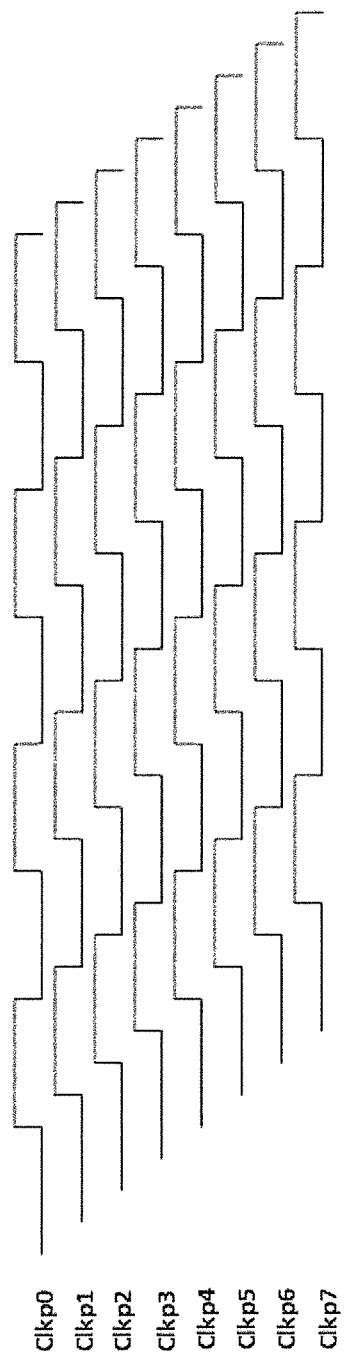
FIG. 2 illustrates a timing diagram of example clock signals generated by the PLL of FIG. 1.

FIG. 2 illustrates a timing diagram of example clock signals generated by the PLL of FIG. 1. FIG. 2 shows eight clock signals, each phase shifted with respect to each other, with the clock signals labeled from Clkp0-Clkp7.

Figure 3:
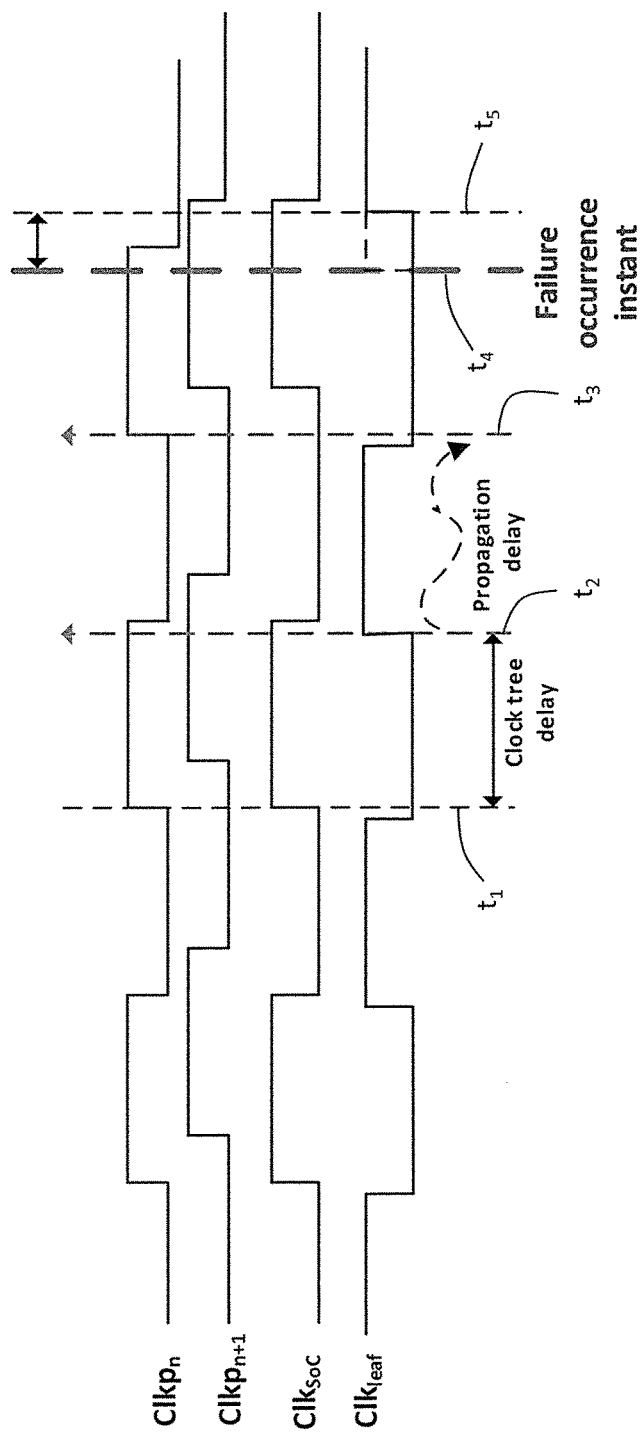
FIG. 3 illustrates a timing diagram showing example clock signals in accordance with aspects of the invention.

FIG. 3 illustrates a timing diagram showing example clock signals in accordance with aspects of the invention. The clock signals, for example, may be clock signals of the embodiment of FIG. 1. The clock signals include a clock signal $Clkp_n$, which is an initially selected clock signal, a clock signal $Clkp_{n+1}$, which is a subsequently selected clock signal, a clock signal $Clk_{SoC}$, which is a clock signal for use by logic circuitry of an integrated circuit (at a point of initial distribution of the clock signal), and a clock signal $Clk_{leaf}$, which is the clock signal $Clk_{Soc}$ after passage through a clock tree (and where actually utilized by the logic circuitry).

The clock signal $Clkp_n$ and $Clkp_{n+1}$ both have the same frequency, but differ in phase, and both clock signals may be generated by a PLL. At a time t1 it may be seen that the clock signal $Clk_{Soc}$, and the clock signal $Clkp_n$ both transition from a low to high state, indicating that the clock signal $Clkp_n$ is currently selected as the clock signal for use by the logic circuitry. At a time t2, subsequent to time t1, it may be seen that the clock signal $Clk_{leaf}$ transitions from a low to high state, with the time t2-t1 indicating a propagation delay as the clock signal $Clk_{Soc}$ travels through the clock tree.

At a time t3 the clock signal $Clkp_n$ once again transitions from a low to high state. The clock signal $Clk_{Soc}$, however, does not transition from a low to high state at time t3, indicating that the clock signal $Clkp_{n+1}$ is no longer selected for use by the logic circuitry. Instead, for example due to a monitor block indicating detection of a voltage droop, the clock signal Clkpn+1 has been selected for use by the logic circuitry. This may be seen with the clock signal $Clk_{Soc}$ transitioning from a low to high state concurrently with the clock signal $Clkp_{n+1}$ at a time subsequent to time t3, indicating that the clock signal $Clkp_{n+1}$ has been selected for use by the logic circuitry. Effectively, therefore, a clock period of the clock signal $Clk_{Soc}$, has been stretched, or extended in time.

At a time t4 the clock signal $Clk_{leaf}$ would transition from a low state to a high state, if $Clkp_n$ were still the selected clock signal. Due to the detected voltage droop, a logic failure would have been expected at that time. However, as $Clk_{Soc}$ has transitioned to the clock signal $Clkp_{n+1}$, the rising edge of $Clk_{leaf}$ has been delayed to time t5, providing sufficient time for the logic operations of the logic circuitry to complete.

With respect to FIGS. 1-3, in various embodiments:

n clock phases are obtained from VCO cells. They are available at no cost as traditional VCOs align more than 8 cells.

The phases are placed in a fixed wheel, and only one phase is selected as the SOC clock by a turning needle.

Several monitors distributed through the SoC sense the supply droop about to create a timing failure.

Any of these alarms moves clockwise forward the wheel pointer by a predefined step.

Depending on the severity of the droops, it might be decided using logic means, for example logic circuitry, to move the pointer 1, 2, or as needed or desired steps to prevent timing failure.

The monitors translate power droop into delay that is compared to a predefined delay reference.

Fine granularity of clock phase may put performance throttling under control.

Figure 4:
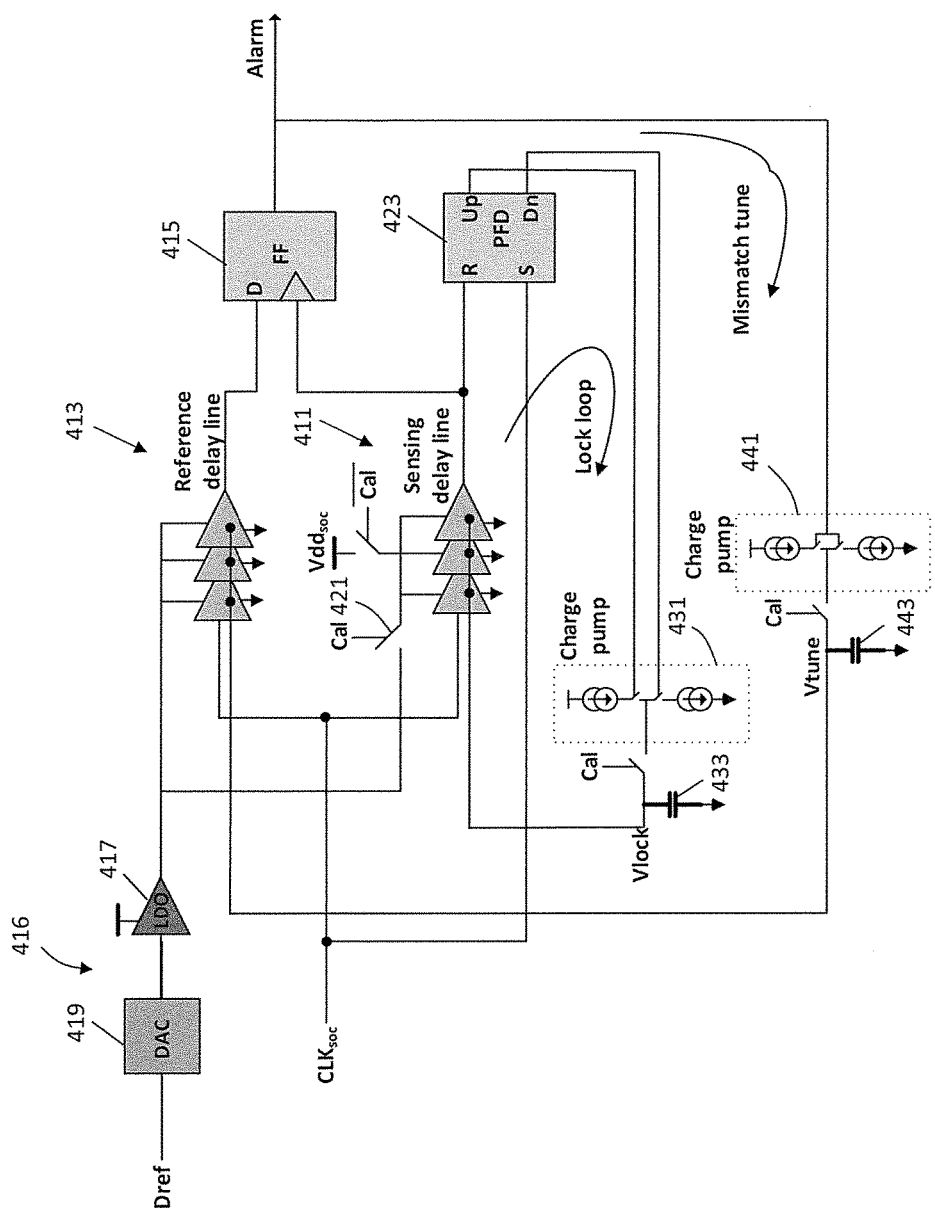
FIG. 4 is a block diagram of a monitor block in accordance with aspects of the invention.

FIG. 4 is a block diagram of an example monitor block in accordance with aspects of the invention. In some embodiments the monitor block of FIG. 4, or portions thereof, is used as the monitor block of FIG. 1. The monitor block effectively compares a delay of a sensing delay line 411 with a delay of a reference delay line 413 to determine if a regulated supply voltage droop has occurred. In various embodiments, and as shown in FIG. 4, the monitor block additionally includes circuitry to effectively set a delay length for the sensing delay line, circuitry to match the delay of the reference delay line to that of the sensing delay line, and circuitry to provide a predefined or definable set voltage to supply the reference delay line. In some embodiments the additionally included circuitry is included in whole, as shown in FIG. 4, or in part, or not at all.

The sensing delay line 411 and the reference delay line each receive a clock signal $CLK_{SOC}$. The clock signal $CLK_{SOC}$ may be for example, the $Clk_{SoC}$ signal or the $Clk_{leaf}$ signal of FIG. 3. The delay lines provide delayed versions of the signal to comparison circuitry, which in the embodiment of FIG. 4 is a latch 415. The latch sets it output to the value of the output of the reference delay line on rising edges of the output of the sensing delay line. The delay of thereference delay line is set so as to be greater than the delay of the sensing delay line under nominal regulated voltage supply conditions, with the reverse true if the regulated voltage supply level drops below a voltage expected to result in combinatorial logic failures. Accordingly, the output of the latch will be zero until the regulated voltage supply level drops below the voltage expected to result in combinatorial logic failures, and the output of the latch may be considered to be a voltage droop alarm signal.

In the embodiment of FIG. 4, the sensing delay line receives power from the regulated voltage supply, which for example may be a DC-DC switching converter (not shown). The reference delay line receives power from reference power supply circuitry 416. The reference power supply circuitry supplies power at a voltage at, about, or a safety margin above a voltage level at which combinatorial logic failures would be expected. In the embodiment of FIG. 4, the reference power supply circuitry comprises a low dropout (LDO) regulator 417. The LDO regulator receives power from a power supply source other than the regulated voltage supply, and in many embodiments the LDO regulator receives power from the same power source providing power to the DC-DC switching converter providing the regulated voltage supply. Also in the embodiment of FIG. 4, the LDO regulator sets its output voltage at a level determined by a digital-to-analog converter (DAC) 419, allowing for system setting of a desired output voltage.

The embodiment of FIG. 4 additionally includes a lock loop to set a delay of the sensing delay line to a predetermined delay, in the case of FIG. 4 a delay that covers a clock cycle, and a tuning loop to tune a delay of the reference delay line to that of the sensing delay line, under the same supply voltage conditions. In the embodiment of FIG. 4, both the lock loop and the tuning loop are operational during a calibration mode, and non-operational during an operational mode in which the monitor block monitors for a voltage droop.

The lock loop includes a phase and frequency detector (PFD) 423 which operates on the output of the sensing delay line and the clock signal CLKSOC. The PFD provides up/down signals to a first charge pump 431, the output of which, in calibration mode, charges a lock capacitor 433 with a voltage Vlock. The voltage Vlock is used to modify speed of operation of the sensing delay line, with the voltage Vlock varying during calibration until the output of the sensing delay line is phase and frequency locked to the clock signal CLKSOC.

The tuning loop utilizes the alarm signal to operate a second charge pump 441, the output of which, in calibration mode, charges a tuning capacitor 443 with a voltage Vtune. The voltage Vtune is used to modify speed of operation of the reference delay line. When delay of the reference delay line does not approximate delay of the sensing delay line, the alarm signal will generally either be high or be low, depending on the offset between the two delay lines. Once the delays are closing to matching, with the relative delays effectively slightly toggling in comparative length with respect to each other, the alarm signal will also generally toggle between a high and low state, indicating the delay lines substantially match.

In summary, operation of the monitor block of FIG. 4 may be as indicated in Table I:

TABLE I

| Calibration mode (cal = 1) | Normal operation (cal = 0) |
| --- | --- |
| Sensing delay line supply connected to LDO | Sensing delay line supply connects to Vddsoc |
| Reference delay line supply permanently connected to LDO | Reference delay line supply permanently connected to LDO. As sensing delay line supply voltage is normally higher than the LDO supplied voltage, the delay for the sensing delay line is shorter |
| Both loops are closed | Both loops are open, Vlock and Vtune stored on capacitors |
| Sensing delay line locked on a reference clock to make sure logic delay line stretches all over the clock period | Sensing delay line faster than the reference delay line samples 0's at the flip flop. If $Vdd_{soc}$ supply drops below LDO supply reference, reference delay line starts to sample 1's on FF. The alarm flag is then raised |
| Reference delay line locks on the sensing delay line to provide matching, in some embodiments near perfect, between the two delay lines Lock is obtained when Alarm is toggling | The chain of delay elements detects the effect of supply variation on timings. |

Figure 5:
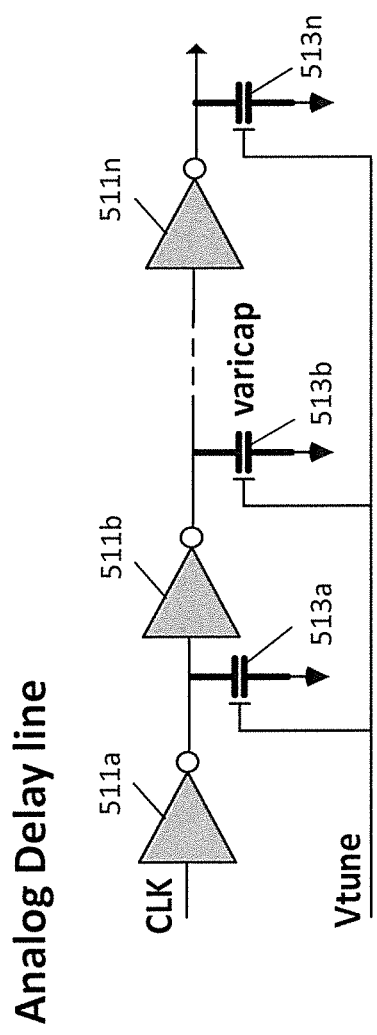
FIG. 5 illustrates an embodiment of an analog delay line, which may be used as the sensing delay line and the reference delay line of the embodiment of FIG. 4.

FIG. 5 illustrates an embodiment of an analog delay line, which may be used as the sensing delay line and the reference delay line of the embodiment of FIG. 4. The analog delay line includes a series of inverters 511*a-n*, with capacitors 513*a-n* coupled to ground between the inverters (and after the ultimate inverter in the series of inverters). In the embodiment of FIG. 5, the capacitors are variable capacitors, with a capacitance set by Vtune, for the reference delay line, or Vlock, for the sensing delay line. Adjustment of the capacitance of the variable capacitors adjusts speed of operation of the delay line.

In various embodiments:

As the delay line is used to sense supply variations and convert it to delay, the tuning is preferably performed on the capacitor (PSRR=1).

Current starving inverters have a high PSRR and may not be as suitable to supply monitoring.

Figure 11:
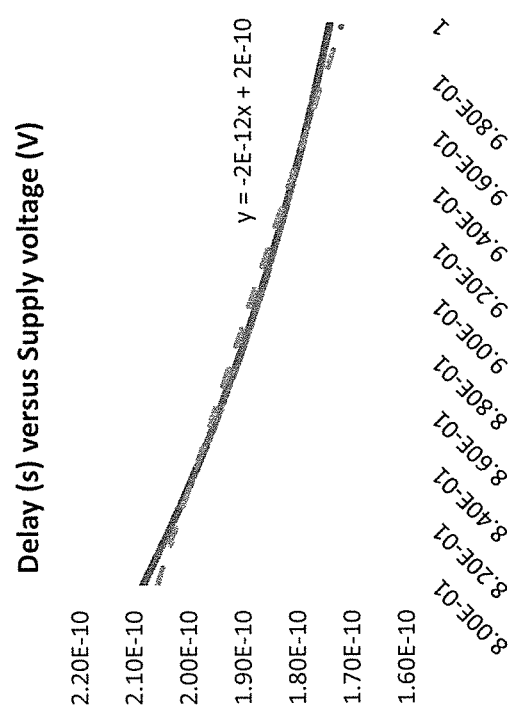
FIG. 11 is a graph of delay time versus voltage.

Delay versus supply is decently linear within useful range, as may be seen in FIG. 11, which graphs delay time versus voltage.

As failure mechanism is related to delay in critical paths, the delay line senses the effect of a supply voltage droop.

Figure 6:
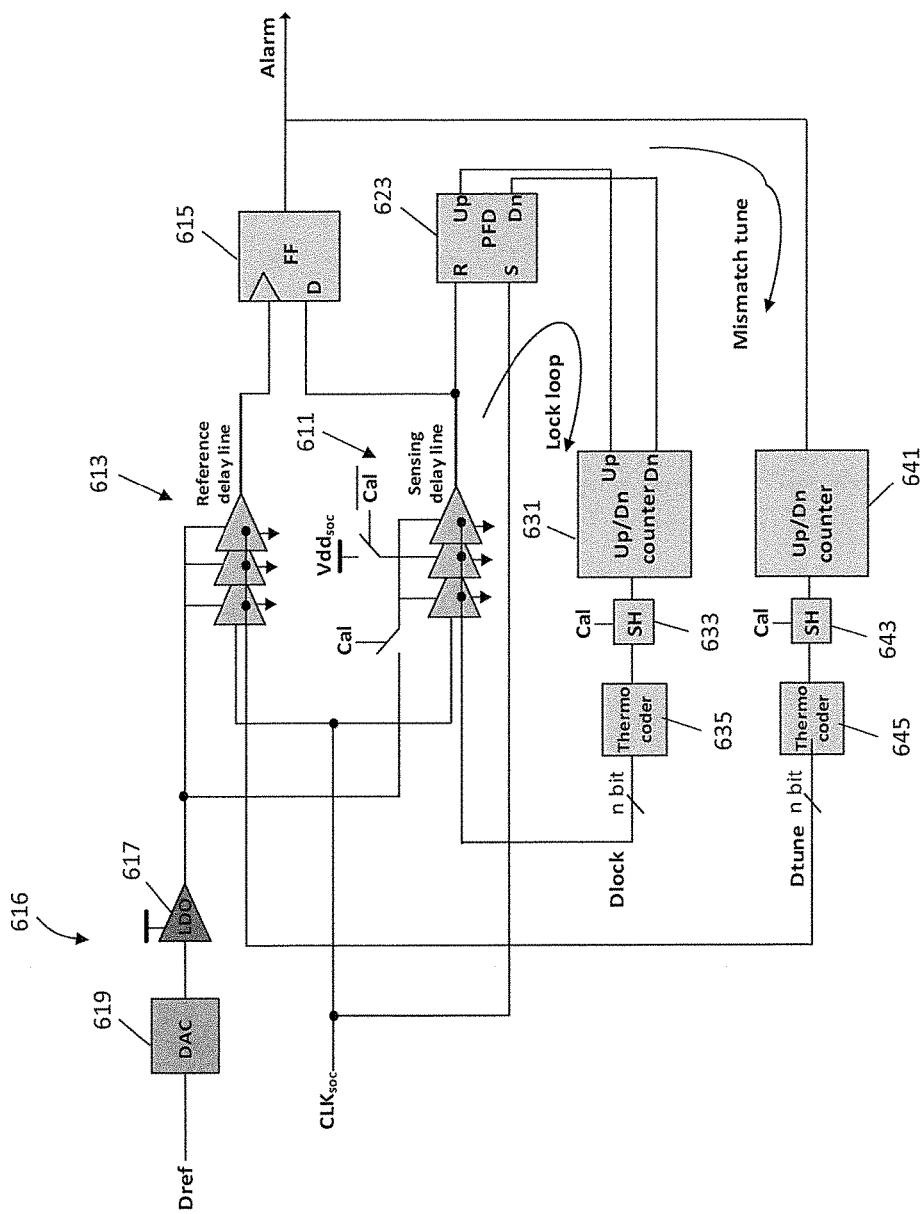
FIG. 6 is a block diagram of a further embodiment of a monitor block in accordance with aspects of the invention.

FIG. 6 is a block diagram of a further embodiment of a monitor block in accordance with aspects of the invention. In some embodiments the monitor block of FIG. 6 is used for the monitor block of FIG. 1.

The monitor block of FIG. 6 is similar to the monitor block of FIG. 4, with the monitor block of FIG. 6 including a sensing delay line 611, a reference delay line 613, a latch 615, reference power supply circuitry 616 comprised of an LDO 617 setting an output voltage in accordance with output of a DAC 619, and a PFD 623, with all arranged as discussed with respect to the embodiment of FIG. 4. The embodiment of FIG. 6 also includes a lock loop and a tuning loop.

In the embodiment of FIG. 6, however, the delay lines, lock loop, and tuning loop are implemented with digital components. The lock loop includes a first up/down counter 631 in place of a charge pump, with an output of the first up/down counter provided, in calibration mode, to a first thermocoder 635. The first thermocoder provides a multibit output to the sensing delay line, for adjusting a delay of the sensing delay line. Similarly, the tuning loop includes a second up/down counter 641, in place of a charge pump, with an output of the second up/down counter provided, in calibration mode, to a second thermocoder 645. The second thermocoder provides a multibit output to the reference delay line, for adjusting a delay of the reference delay line.

In summary, for the embodiment of FIG. 6:

Fully digital concept

Digital charge pump, integrator, up down counter

Delay line implemented in switchable logic gates or tristate logic gates

Suitable to FPGA implementation for concept validation

FIGS. 7A and 7B illustrate an embodiment of digitally controlled delayed lines, for example for use in the monitor block of FIG. 6. The embodiment of FIG. 7A utilizes a series of switchable logic gates 711*a-n*, controlled by control signals from the first and second thermocoders, for the sensing delay line and the reference delay line, respectively. The embodiment of FIG. 7B utilizes a series of tristate logic gates, again controlled by control signals from the first and second thermocoders, for the sensing delay line and the reference delay line, respectively.

Figure 8A:
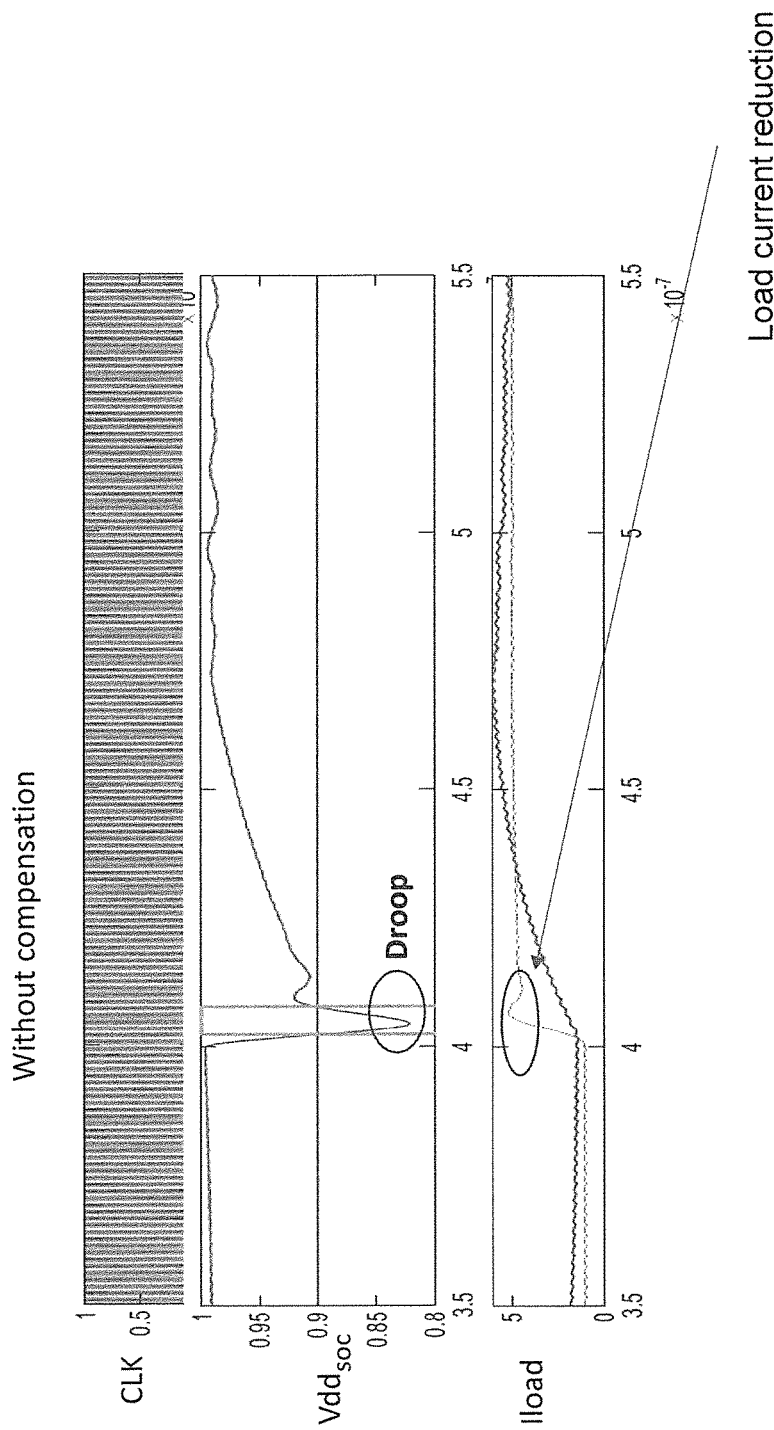
FIGS. 8A and 8B illustrate benefits of operation of a system such as the system of FIG. 1.
Figure 8B:
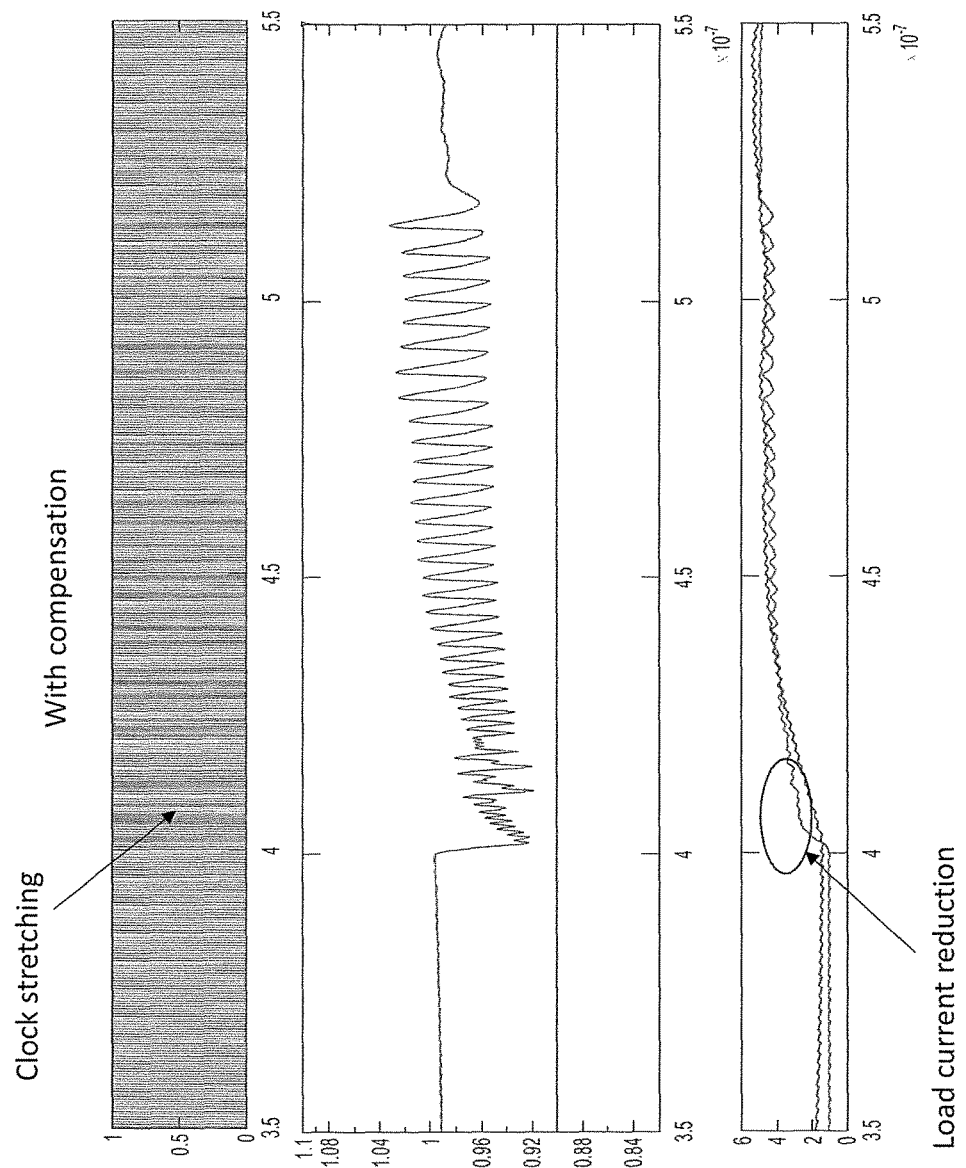

FIGS. 8A and 8B illustrate possible benefits of operation of a system such as the system of FIG. 1. FIG. 8A is a graph showing regular operation of a clock signal over a time period, regulated supply voltage $Vdd_{SOC}$ over the same time period, and current load Iload again over the same time period. During operation, $Vdd_{SOC}$ experiences a voltage droop, shown as well below 0.9 Volts, at a time when Iload increases substantially, indicating increased current draw by circuitry of an SoC. By comparison, FIG. 8B, showing operation of an integrated circuit including a system such as the system of FIG. 1, illustrates clock stretching of the clock signal, with a reduced voltage droop and less rapid increase in Iload.

In summary:

Droop effect is compensated twofold.

Clock stretching prevents critical logic paths from failing.

Clock stretching temporally reduces switching frequency that translates into load current reduction.

Figure 9:
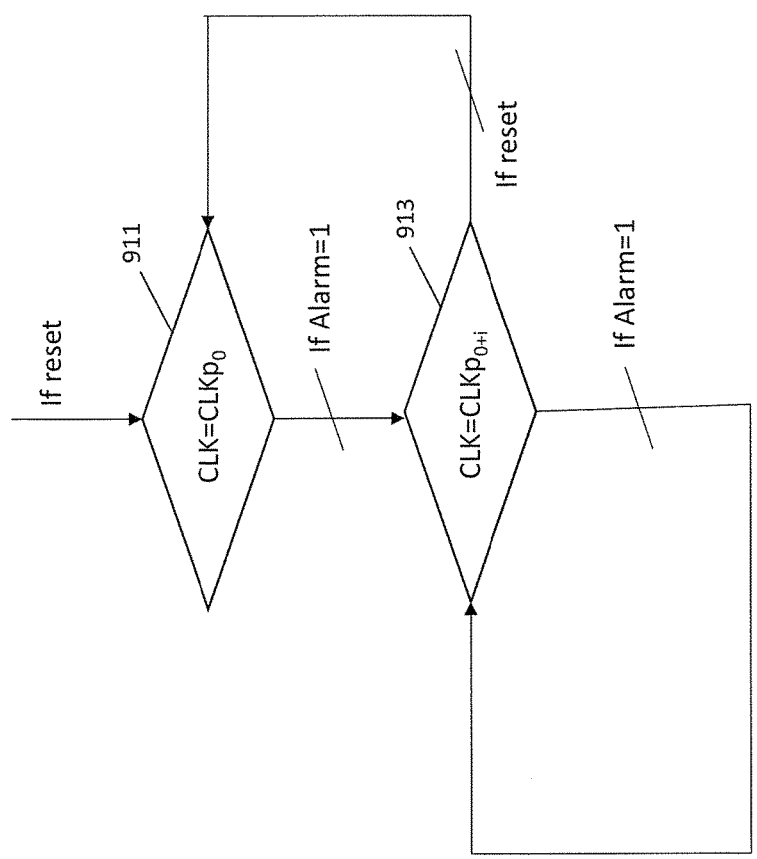
FIG. 9 is a flow diagram of logic operations which may be used to select a clock signal for use by logic circuitry.
Figure 10A:
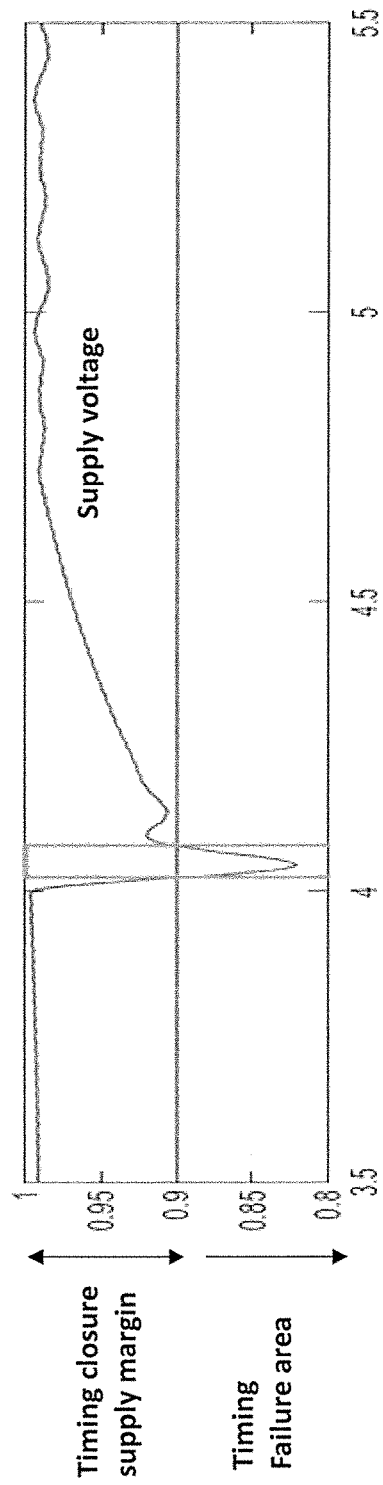
FIGS. 10A and 10B illustrate a load current transient, in which load current rapidly increases, and a corresponding voltage droop.
Figure 10B:
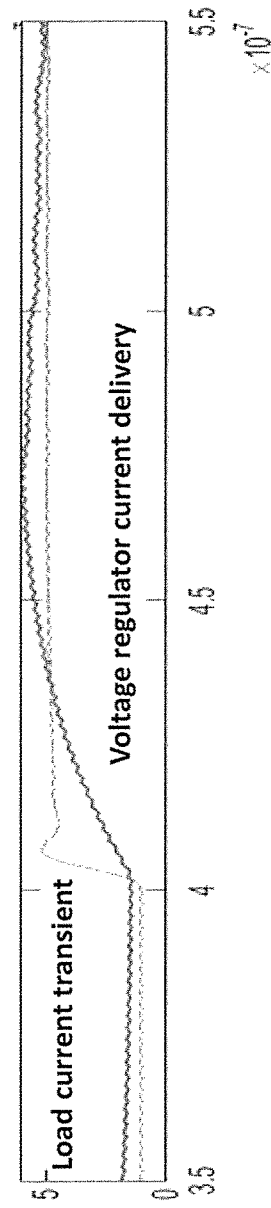

FIG. 9 is a flow diagram of logic operations which may be used to select a clock signal for use by logic circuitry. In some embodiments the logic operations of FIG. 9 are implemented by the sync circuitry of FIG. 1. In block 911 a clock with a first clock phase, for example $Clkp_0$ of the clock phases of FIG. 2, is selected for use as a system clock signal. If an alarm signal, for example from a monitor block, goes high, a next clock signal, with delayed phase, is selected for use as the system clock signal. This effectively stretches a period of the system clock signal. If the alarm signal again goes high or, in some embodiments remains high over a predefined time period, a further next clock signal, $Clkp_{0+i}$, i a non-zero integer, is selected for use as the system clock signal, again effectively stretching a period of the system clock signal.

Although the invention has been discussed with respect to various embodiments, it should be recognized that the invention comprises the novel and non-obvious claims supported by this disclosure.

What is claimed is:

1. A system for compensating for voltage droops in power supplied to integrated circuitry, comprising:
a plurality of droop monitors within an integrated circuit, the droop monitors configured to detect occurrence of a droop in voltage level below a specified level of a regulated supply voltage; and
clock adjustment circuitry configured to stretch a period of a clock signal supplied to portions of the integrated circuit in response to detection of the occurrence of the droop in voltage level below the specified level;
wherein the droop monitors are configured to monitor a speed of execution of sensing integrated circuitry compared to speed of execution of reference integrated circuitry;
wherein the sensing integrated circuitry comprises a sensing delay line and the reference integrated circuitry comprises a reference delay line;
wherein the droop monitors include a lock loop to set a delay of the sensing delay line to a predetermined delay.

2. The system of claim 1, wherein the sensing delay line and the reference delay line each comprise a digital delay line.

3. The system of claim 1, wherein the predetermined delay covers a clock cycle of a system clock signal.

4. The system of claim 1, wherein the droop monitors include a tuning loop to tune a delay of the reference delay line to a delay of the sensing delay line.

5. The system of claim 1, further comprising a low dropoff regulator to provide power to the reference integrated circuitry at a first voltage level and a DC-DC switching regulator to provide power to the sensing integrated circuitry is provided power at a regulated supply voltage level.

6. The system of claim 1, wherein the clock adjustment circuitry is configured to select a system clock signal at a particular phase from a plurality of clock signals each having different phases.

7. The system of claim 6, wherein the clock adjustment circuitry is configured to stretch a period of the system clock signal supplied to portions of the integrated circuit by selecting a next to be used clock signal that is phase delayed compared to a currently used clock signal.

8. A system for compensating for voltage droops in power supplied to integrated circuitry, comprising:
 a plurality of droop monitors within an integrated circuit, the droop monitors configured to detect occurrence of a droop in voltage level below a specified level of a regulated supply voltage; and
 clock adjustment circuitry configured to stretch a period of a clock signal supplied to portions of the integrated circuit in response to detection of the occurrence of the droop in voltage level below the specified level;
 wherein the droop monitors are configured to monitor a speed of execution of sensing integrated circuitry compared to speed of execution of reference integrated circuitry;
 wherein the sensing integrated circuitry comprises a sensing delay line and the reference integrated circuitry comprises a reference delay line;
 wherein the droop monitors include a tuning loop to tune a delay of the reference delay line to a delay of the sensing delay line.

9. The system of claim 8, wherein the sensing delay line and the reference delay line each comprise a digital delay line.

10. The system of claim 8, wherein the droop monitors include a lock loop to set a delay of the sensing delay line to a predetermined delay.

11. The system of claim 10, wherein the predetermined delay covers a clock cycle of a system clock signal.

12. The system of claim 8, further comprising a low dropoff regulator to provide power to the reference integrated circuitry at a first voltage level and a DC-DC switching regulator to provide power to the sensing integrated circuitry is provided power at a regulated supply voltage level.

13. The system of claim 8, wherein the clock adjustment circuitry is configured to select a system clock signal at a particular phase from a plurality of clock signals each having different phases.

14. The system of claim 13, wherein the clock adjustment circuitry is configured to stretch a period of the system clock signal supplied to portions of the integrated circuit by selecting a next to be used clock signal that is phase delayed compared to a currently used clock signal.

* * * * *

UNITED STATES PATENT AND TRADEMARK OFFICE
CERTIFICATE OF CORRECTION

PATENT NO.         : 10,320,375 B2
APPLICATION NO.    : 15/640922
DATED              : June 11, 2019
INVENTOR(S)        : Hassan Ihs Page 1 of 1

It is certified that error appears in the above-identified patent and that said Letters Patent is hereby corrected as shown below:

In the Specification

In Column 4, Line 49, delete "Clkp$_{n+1}$" and insert --Clkp$_n$--, therefor.

In Column 5, Lines 42-43, delete "thereference" and insert --the reference--, therefor.

Signed and Sealed this
Fourteenth Day of April, 2020

Andrei Iancu
*Director of the United States Patent and Trademark Office*